(12) United States Patent
Park et al.

(10) Patent No.: US 8,765,358 B2
(45) Date of Patent: Jul. 1, 2014

(54) WATER-SOLUBLE RESIN COMPOSITION AND METHOD OF FORMING FINE PATTERNS BY USING THE SAME

(75) Inventors: Sang Wook Park, Chungcheongnam-do (KR); So Jung Park, Chungcheongnam-do (KR); Dong-Chul Seo, Chungcheongnam-do (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 0 days.

(21) Appl. No.: 13/171,623

(22) Filed: Jun. 29, 2011

(65) Prior Publication Data
US 2012/0189963 A1 Jul. 26, 2012

(30) Foreign Application Priority Data
Jan. 21, 2011 (KR) .................. 10-2011-0006334

(51) Int. Cl.
| | | |
|---|---|---|
| *G03F 7/40* | (2006.01) | |
| *G03F 7/30* | (2006.01) | |
| *G03F 7/20* | (2006.01) | |
| *C08F 232/04* | (2006.01) | |
| *C08F 222/38* | (2006.01) | |

(52) U.S. Cl.
USPC ........... 430/311; 430/326; 430/325; 430/328; 430/330; 430/331; 430/270.1; 430/905; 430/910; 526/281; 526/303.1; 526/304; 526/307; 526/307.2; 526/307.3; 526/307.5; 526/307.7

(58) Field of Classification Search
None
See application file for complete search history.

(56) References Cited

U.S. PATENT DOCUMENTS

| | | | | |
|---|---|---|---|---|
| 8,187,790 | B2 * | 5/2012 | Joo et al. ................... | 430/280.1 |
| 2006/0160015 | A1 * | 7/2006 | Takano et al. ............. | 430/270.1 |
| 2008/0193880 | A1 * | 8/2008 | Nishibe et al. ............ | 430/286.1 |
| 2010/0081079 | A1 * | 4/2010 | Joo et al. ................... | 430/270.1 |

* cited by examiner

*Primary Examiner* — Sin J. Lee
(74) *Attorney, Agent, or Firm* — Ladas & Parry LLP

(57) ABSTRACT

A water-soluble resin composition for forming fine patterns comprising water-soluble polymer represented by Chemical Formula 1 as below and the first water-soluble solvent, is coated and heated on a photoresist layer having at least one contact hole to reduce a size of the at least one contact hole.

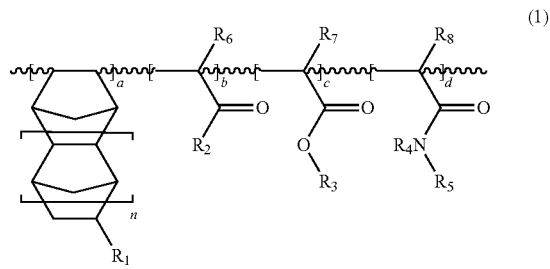

(In Chemical Formula 1,
each of $R_1$, $R_2$, $R_3$ and $R_5$ independently represents an alkyl group of $C_{1-30}$ or an cyclo alkyl group of $C_{3-30}$ which respectively have one selected from the group consisting of hydrogen, an ether group, an ester group, a carbonyl group, an acetal, an epoxy group, a nitril group, an amine group, and an aldehyde group;
each of $R_4$, $R_6$, $R_7$ and $R_8$ independently represents hydrogen or a methyl group;
n represents an integer of 0 to 5;
a represents a real number of 0.05 to 0.5;
each of b, c and d respectively represents a real number of 0 to 0.7; and
a+b+c+d=1).

19 Claims, No Drawings

WATER-SOLUBLE RESIN COMPOSITION AND METHOD OF FORMING FINE PATTERNS BY USING THE SAME

CROSS-REFERENCE TO RELATED APPLICATIONS

This application claims the benefit of Korean Patent Application No. 10-2011-0006334, filed on Jan. 21, 2011, in the Korean Intellectual Property Office, the disclosure of which is incorporated herein by reference.

BACKGROUND

1. Field of the Invention

The presented techniques are related to a resin composition and a method of stably forming a fine pattern in a semiconductor process by using the resin composition as a coating layer of a photoresist.

2. Description of the Related Art

Development is accelerated by a trend of high quality and a high integration of semiconductor devices, and by development of the lithography processes. According to above trend and development, a chemically amplified photoresist corresponding to a miniature of deign rule is also developed. However, in general, minimum resolution realized by using an ArF exposure apparatus is about 0.05 μm. Therefore, it is difficult to manufacture a high integrated semiconductor devices that need fine patterns, and then variable methods are considered to overcome above problems.

As an example method that is widely used by this time includes a resist thermal reflow method allowing a liquidity to a photoresist by heat-treating to the photoresist. By this method, a size of a contact hole may be reduced by heat-treating the photoresist at a temperature over a glass transition temperature of the photoresist after the contact hole is formed on the photoresist. However, by this method, a top-rounding and a undercut are generated, so that a control of critical dimension may be difficult.

Another method that used to overcome the above method may include using a functional materials such as RELACS (manufactured by CLARIRANT Co., Switzerland) and SAFIER (manufactured by TOKYO OHKA KOGYO CO., LTD., Japan) to reduce a size of the pattern. The method using a functional materials lead to a cross linkage between the functional materials and the photoresist an interface in that the size of the contact hole may be reduced. However, the method using the functional materials needs to repeat cross linkage process at least a several times to decrease an efficiency. Also, the functional materials are poor at an anti-etching characteristic because they don't have a bulky portion in the polymer. Furthermore, the method above is insufficient to meet a coating characteristic required to the pattern, and it is difficult to control a thickness of the cross-linkage under the heat-treating process.

SUMMARY

An exemplary embodiment of the present invention, a water-soluble resin composition for forming fine patterns comprises water-soluble polymer represented by Chemical Formula 1 as below and the first water-soluble solvent, and the water-soluble resin composition is coated and heated on a photoresist layer having at least one contact hole to reduce a size of the at least one contact hole.

[Chemical Formula 1]

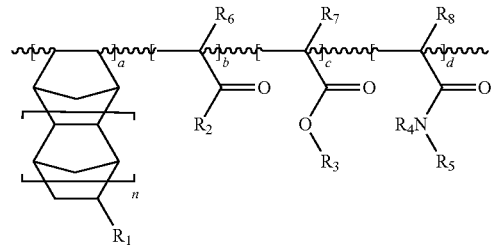

(In Chemical Formula 1, each of $R_1$, $R_2$, $R_3$ and $R_5$ independently represents an alkyl group of $C_{1-30}$ or an cyclo alkyl group of $C_{3-30}$ which respectively have one selected from the group consisting of hydrogen, an ether group, an ester group, a carbonyl group, an acetal, an epoxy group, a nitrile group, an amine group, and an aldehyde group;

each of $R_4$, $R_6$, $R_7$ and $R_8$ independently represents hydrogen or a methyl group;

n represents an integer of 0 to 5;

a represents a real number of 0.05 to 0.5;

each of b, c and d respectively represents a real number of 0 to 0.7; and $a+b+c+d=1$)

The water-soluble solvent comprises about 100 parts by weight of water and about 1 to about 20 parts by weight of an alcohol. The water-soluble resin composition comprise about 100 parts by weight of the water-soluble solvent and about 0.01 to about 15 parts by weight of the water-soluble polymer.

The alcohol may comprise an alkoxy alcohol.

The water-soluble polymer has about 3,000 to about 50,000 of polystyrene-referenced weight-average molecular weight (Mw) by Gel-permeation chromatography (GPC).

The water-soluble polymer has about 1.0 to about 5.0 of molecular weight distribution (weight-average molecular weight/number-average molecular weight).

Another exemplary embodiment of the present invention, a method of forming fine pattern comprising forming a photoresist layer, forming a contact hole on the photoresist layer by photolithography method to prepare a photoresist pattern layer, coating water-soluble resin composition of claim 1 on the photoresist pattern layer, heat-treating the photoresist pattern layer coated by the water-soluble resin composition to form a coating layer having cross-linked part, and applying the second water-soluble solvent to the coating layer for removing the coating layer except the cross-linked part.

The second water-soluble solvent may comprise water.

The heat-treating of the photoresist pattern layer is preferably performed at a temperature of about 100° C. to about 200° C. A size of the contact hole is adjusted to a temperature of the heat-treating.

The photoresist layer includes norbornene derivatives, and the photoresist layer comprises a non-water-soluble layer.

EFFECT

According to exemplary embodiment, the water-soluble resin composition allows fine contact hole less than about 0.05 μm to be formed in the semiconductor process. Also the water-soluble resin composition may reduce defects of the structure such as a top rounding and undercut to increase a miniature and a stability of the semiconductor device including variable patterns.

According to another exemplary embodiment of the method, a photoresist layer having fine contact holes is effectively and stably manufactured.

DETAILED DESCRIPTION

Hereinafter, a resin composition according to exemplary embodiments will be described in detail.

The water-soluble resin composition according to an embodiment of the invention comprises polymer of Formula 1 and water-soluble solvent.

[Chemical Formula 1]

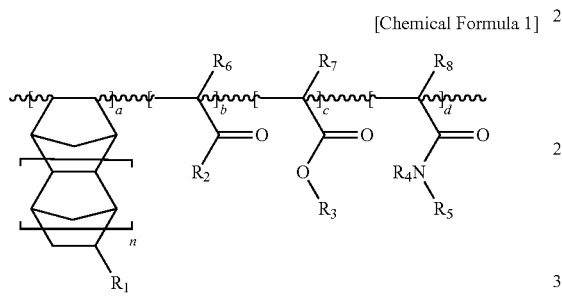

In Chemical Formula 1, each of $R_1$, $R_2$, $R_3$ and $R_5$ independently represents an alkyl group of $C_{1-30}$ or an cyclo alkyl group of $C_{3-30}$ which respectively have one selected from the group consisting of hydrogen, an ether group, an ester group, a carbonyl group, an acetal, an epoxy group, a nitrile group, an amine group, and an aldehyde group;

each of $R_4$, $R_6$, $R_7$ and $R_8$ independently represents hydrogen or a methyl group;

n represents an integer of 0 to 5;

a represents a real number of 0.05 to 0.5;

each of b, c and d respectively represents a real number of 0 to 0.7; and a+b+c+d=1.

The polymer represented by Formula 1 comprises a repeating unit (a) having norbornene derivatives. The norbornene derivatives have a characteristic of deriving the polymer of Formula 1 to copolymer having a modified spiral structure. A problem of poor solubility in conventional methacrylate based copolymer can be improvement due to the norbornene derivatives in the resin composition according to the invention. Furthermore, there has been difficult to adjust a molecular weight of the conventional methacrylate based copolymer while polymerization and to synthesize polymer having a low molecular weight. However, in the polymer of Formula 1, the repeating unit (a) of the norbornene derivatives has a function of adjusting a molecular weight substantially such that it can be able to adjust polymerization and synthesis polymer having a low molecular weight. Furthermore, the repeating unit (a) of the norbornene derivatives has an aromatic structure to enhance each-resistance.

Examples according to the polymer represented by Formula 1 are described to copolymers of the following Formula 2 to Formula 16.

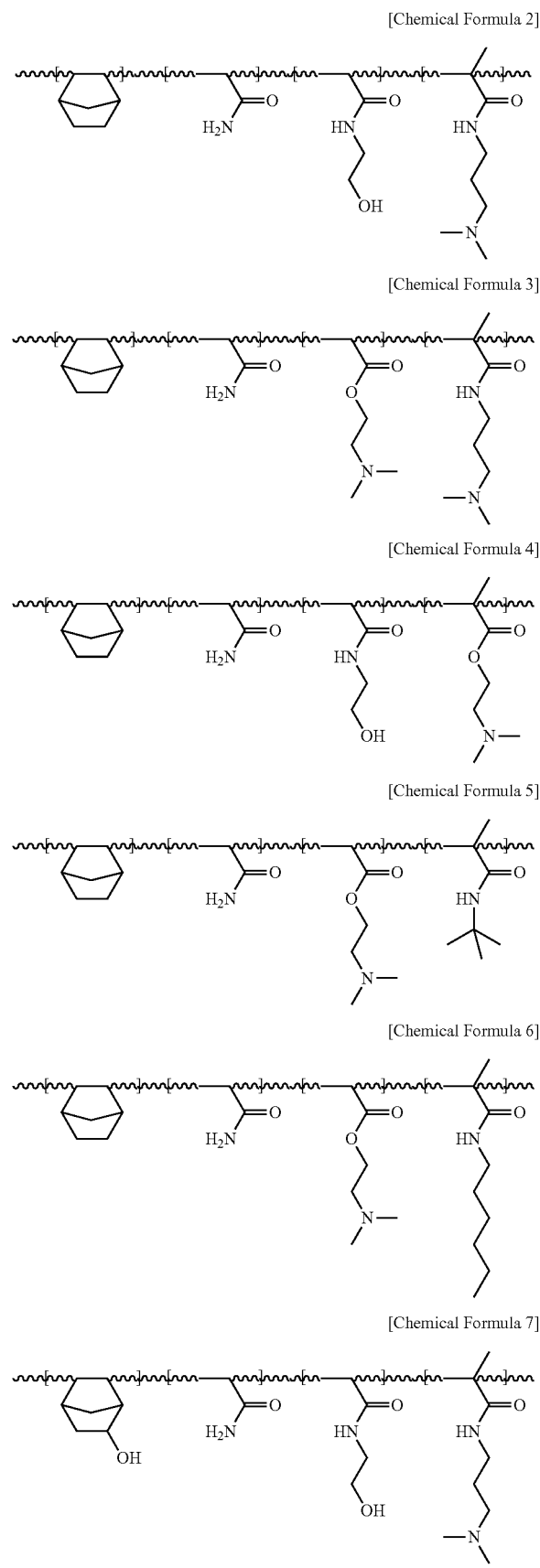

[Chemical Formula 8]

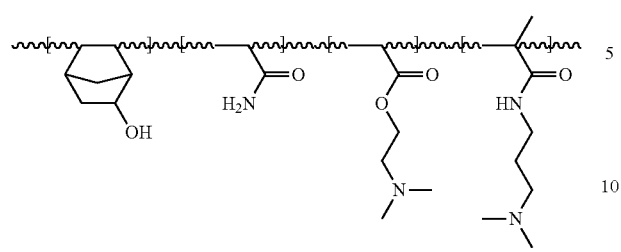

[Chemical Formula 9]

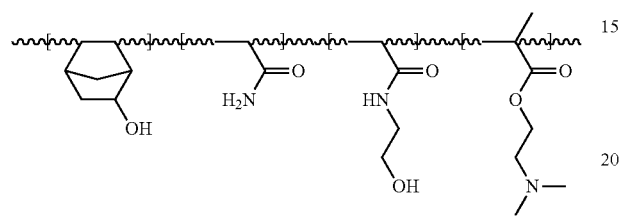

[Chemical Formula 10]

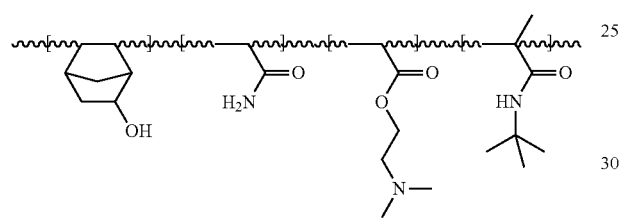

[Chemical Formula 11]

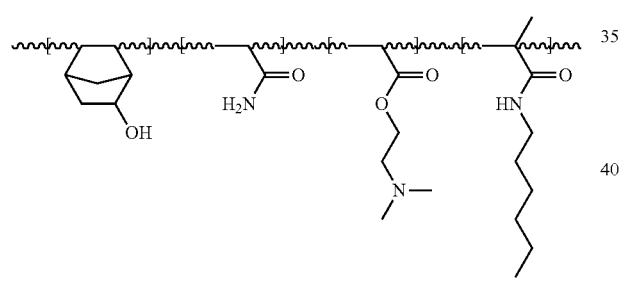

[Chemical Formula 12]

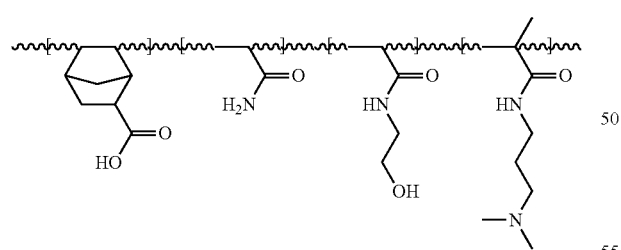

[Chemical Formula 13]

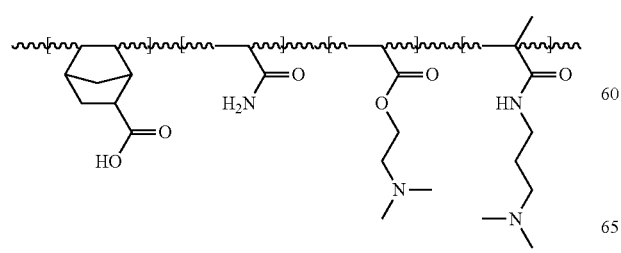

[Chemical Formula 14]

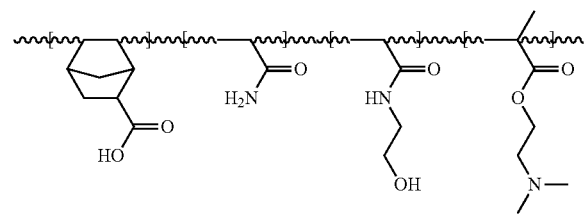

[Chemical Formula 15]

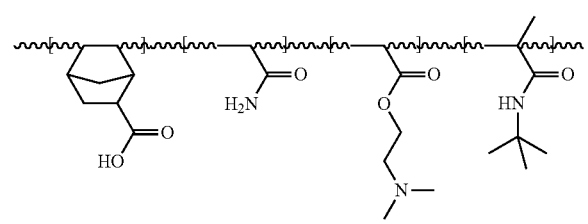

[Chemical Formula 16]

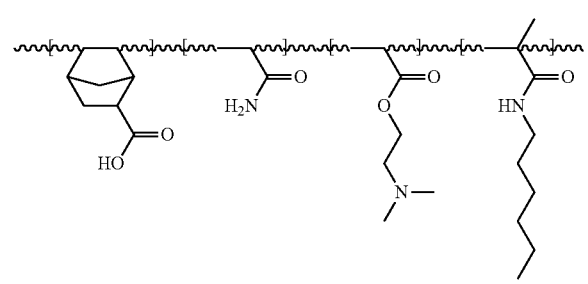

Each of the copolymers represented by Chemical Formula 1 to Chemical Formula 16 may be block copolymer, random copolymer or graft copolymer. The polymers are formed by the conventional polymerization methods, radical polymerization in particular. As an initiator of radical polymerization, azobisisobutyrontrile (AIBN), benzoyl peroxide (BPO), lauroyl peroxide, azobisisocapronitrile, azobisisovaleronitrile, t-butyl hydroperoxide or the like may be used, but the invention is not limited by a kind of the initiator of radical polymerization. A method of polymerization may comprise, for example, bulk polymerization, solution polymerization, suspension polymerization, bulk suspension polymerization, emulsion polymerization or the like. Furthermore, a polymerization solvent may be, for example, benzene, toluene, xylene, halogenated benzene, diethyl ether, tetrahydrofuran, esters, ethers, lactones, ketones, amides, alcohols, and so on. Each of the polymerization solvents or a mixture of at least two of the polymerization solvents may be used.

Polymerization temperature may be set properly according to a kind of catalyst. Distribution of molecular weight of the polymer may be adjusted properly according to usage and reaction time of polymerization initiator. After polymerization is finished, unreacted monomers and byproducts in a reaction mixture may be removed by the solvent precipitation.

Polystyrene-referenced weight-average molecular weight (Mw) of the polymer according to gel-permeation chromatography (GPC) is from about 2,000 to about 1,000,000, particularly from about 3,000 to about 50,000 when properties of photoresist such as sensitivity, a developing property, a coating property, thermal endurance or the like are considered. Furthermore, the distribution of molecular weight of the polymer is from about 1.0 to about 5.0, specifically from about 1.0 to about 3.0.

In an embodiment of the invention, a mixture of alcohol and water may be used as the water-soluble solvent. In particular, the alcohol may be $C_{1\sim10}$ alkyl alcohol or $C_{1\sim10}$ alkoxy alcohol. The water-soluble solvent may contain about 1 to about 20 parts by weight of alcohol to about 100 parts by weight of water. When the water-soluble solvent contains less than 1 parts by weight of the alcohol, an effect of promoting dissolution is reduced. When the water-soluble solvent contains more than about 20 parts by weight of the alcohol, it is difficult to form a coating layer.

The alcohol may be alkyl alcohol such as, for example, methanol, ethanol, propanol, isopropanol, n-butanol, sec-butanol, t-butanol, 1-pentanol, 2-pentanol, 3-pentanol, 2,2-dimethyl group-propanol and so on; alkoxy alcohol, such as 2-methoxy ethanol, 2-(2-methoxyethoxy)ethanol, 1-methoxy-2-propanol, 3-methoxyl, 2-propandiol and so on. Each of the alcohols or a mixture of at least two alcohol may be used.

Furthermore, the water-soluble resin composition may contain about 0.01 to about 15 parts by weight of the water-soluble polymer of solid contents to 100 parts by weight of the water-soluble solvent in particular. When the water-soluble polymer is contained less than about 0.01 parts by weight in the water-soluble resin composition, a coating property is reduced to be insufficient to form a coating layer of the photoresist. When the water-soluble polymer is contained more than about 15 parts by weight in the water-soluble resin composition, a uniformity of the coated layer may be reduced.

The said water-soluble resin composition is coated on a wafer substrate having the photoresist pattern with at least one contact hole and the wafer substrate coated with the water-soluble resin composition is dried to form a film. After filtering the water-soluble resin composition, the filtered solution may be coated on the photoresist pattern by the method of spin coating, flow coating, roller coating and so on. The coated water-soluble resin composition is heat-treated to form a layer with at least one cross-linked part. In other words, the layer with at least one cross-linked part is form by baking a photoresist of the coated water-soluble resin composition to reduce the size of contact hole. Furthermore, the other part that is not cross-linked part in the layer is removed by the water-soluble solvent such as water and so on.

A thickness of the layer with at least one cross-linked part may be controlled according to the heat-treating temperature. Furthermore, the size of the contact hole may be controlled according to the thickness of the layer.

It will be evident to those skilled in the art that the invention is not limited to the details of the foregoing illustrative examples and that the present invention may be embodied in other specific forms without departing from the essential attributes thereof, and it is therefore desired that the present embodiments and examples be considered in all respects as illustrative and not restrictive, reference being made to the appended claims, rather than to the foregoing description, and all changes which come within the meaning and range of equivalency of the claims are therefore intended to be embraced therein.

Synthesis of the Water-Soluble Polymer

Synthesis Example 1

500 ml 3-neck flask was charged with 10.0 g of monomer acrylamide for polymerization, 7.3 g of hydroxyethylacrylamide and 10.1 g of dimethylaminopropylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a first water-soluble polymer of Formula 2 was collected (21.1 g, 67% yield). Polystyrene-referenced weight-average molecular weight (Mw) of the first water-soluble polymer was 8,500 of and a ratio of weight-average molecular weight to number-average molecular weight (Mw/Mn) thereof was 2.94.

[Chemical Formula 2]

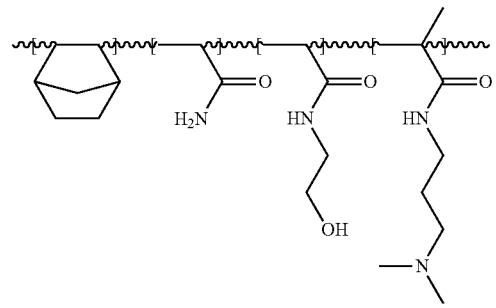

Synthesis Example 2

500 ml 3-neck flask was charged with 11.2 g of monomer acrylamide for polymerization, 7.3 g of dimethylaminoethylacrylate and 10.1 g of dimethylaminopropylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a second water-soluble polymer of Formula 3 was collected (22.1 g, 68% yield). Polystyrene-referenced weight-average molecular weight (Mw) of the second water-soluble polymer was 7,900 of and a ratio of weight-average molecular weight to number-average molecular weight (Mw/Mn) thereof was 2.63.

[Chemical Formula 3]

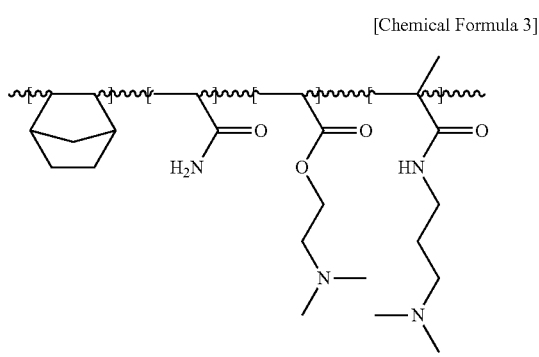

Synthesis Example 3

500 ml 3-neck flask was charged with 10.0 g of monomer acrylamide for polymerization, 9.5 g of hydroxyethylacrylamide and 10.1 g of dimethylaminoethylmethacrylate dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen ($N_2$) injection for one hour while maintaining room-temperature. While maintaining a temperature of a reactor at 65, a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a third water-soluble polymer of Formula 4 was collected (23.7 g, 71% yield). Polystyrene-referenced weight-average molecular weight (Mw) of the third water-soluble polymer was 8,100 of and a ratio of weight-average molecular weight to number-average molecular weight (Mw/Mn) thereof was 2.81.

[Chemical Formula 4]

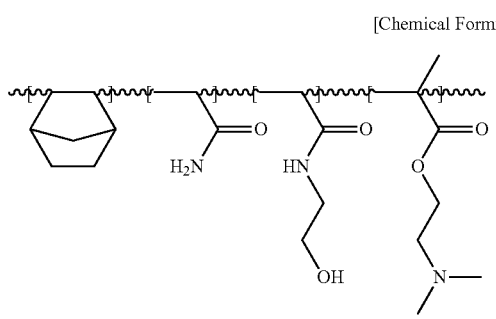

Synthesis Example 4

500 ml 3-neck flask was charged with 15.4 g of monomer acrylamide for polymerization, 4.3 g of dimethylaminoethylacrylate and 10.0 g of tert-butylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a forth water-soluble polymer of Formula 5 was collected (25.2 g, 75% yield). Polystyrene-referenced weight-average molecular weight (Mw) of the forth water-soluble polymer was 8,300 of and a ratio of weight-average molecular weight to number-average molecular weight (Mw/Mn) thereof was 2.75.

[Chemical Formula 5]

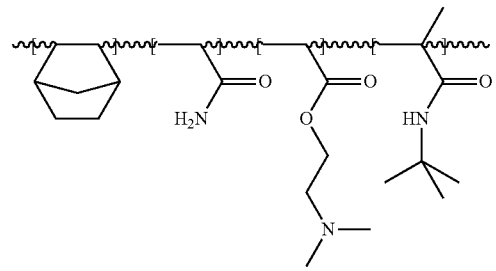

Synthesis Example 5

500 ml 3-neck flask was charged with 7.3 g of monomer acrylamide for polymerization, 9.5 g of dimethylaminoethylacrylate and 10.0 g of n-hexylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65, a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a fifth water-soluble polymer of Formula 6 was collected (25.6 g, 83% yield). Polystyrene-referenced weight-average molecular weight (Mw) of the fifth water-soluble polymer was 7,200 of and a ratio of weight-average molecular weight to number-average molecular weight (Mw/Mn) thereof was 2.65.

[Chemical Formula 6]

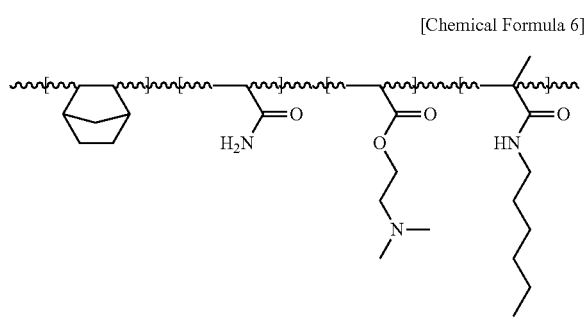

Synthesis Example 6

500 ml 3-neck flask was charged with 10.0 g of monomer acrylamide for polymerization, 7.3 g of hydroxyethylacrylamide and 10.1 g of dimethylaminopropylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a sixth water-soluble polymer of Formula 7 was collected (20.2 g, 64% yield). Polystyrene-referenced weight-average molecular weight (Mw) of the sixth water-soluble polymer was 8,400 of and a ratio of weight-average molecular weight to number-average molecular weight (Mw/Mn) thereof was 3.02.

[Chemical Formula 7]

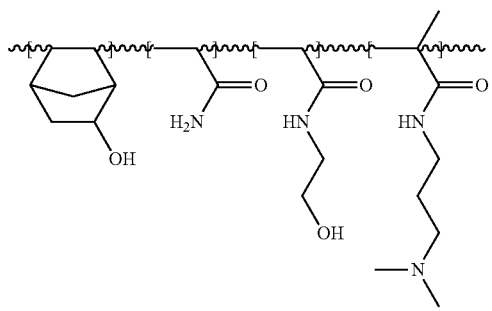

Synthesis Example 7

500 ml 3-neck flask was charged with 10.0 g of monomer acrylamide for polymerization, 10.1 g of dimethylaminoethylacrylate and 8.5 g of dimethylaminopropylmethacrylamide dissolved in 31 g of 1,4-dioxane. 250 ml flask was charged with 4.0 g of norbornene and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a seventh water-soluble polymer of Formula 8 was collected (23.5 g, 72% yield). Polystyrene-referenced weight-average molecular weight (Mw) of the seventh water-soluble polymer was 7,800 of and a ratio of weight-average molecular weight to number-average molecular weight (Mw/Mn) thereof was 2.76.

[Chemical Formula 8]

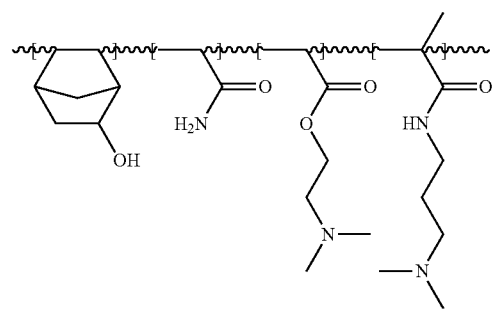

Synthesis Example 8

500 ml 3-neck flask was charged with 10.0 g of monomer acrylamide for polymerization, 10.1 g of hydroxyethylacrylamide and 7.9 g of dimethylaminoethylmethacrylate dissolved in 31 g of 1,4-dioxane. 250 ml flask was charged with 4.0 g of 5-norbornene-2-carboxylic acid and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that the eighth water-soluble polymer of Formula 14 was collected (22.1 g, 69% yield). Polystyrene-referenced weight-average molecular weight (Mw) of the eighth water-soluble polymer was 8,600 of and a ratio of weight-average molecular weight to number-average molecular weight (Mw/Mn) thereof was 2.85.

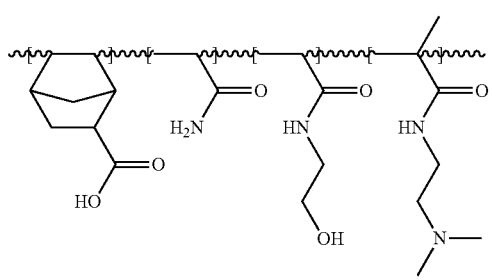

Synthesis Example 9

500 ml 3-neck flask was charged with 10.0 g of monomer acrylamide for polymerization, 8.5 g of dimethylaminoethylacrylate and 9.2 g of tert-butylmethacrylamide dissolved in 31 g of 1,4-dioxane. 250 ml flask was charged with 4.0 g of 5-norbornene-2-carboxylic acid and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a ninth water-soluble polymer of Formula 15 was collected (24.2 g, 76% yield). Polystyrene-referenced weight-average molecular weight (Mw) of the ninth water-soluble polymer was 7,300 of and a ratio of weight-average molecular weight to number-average molecular weight (Mw/Mn) thereof was 2.98.

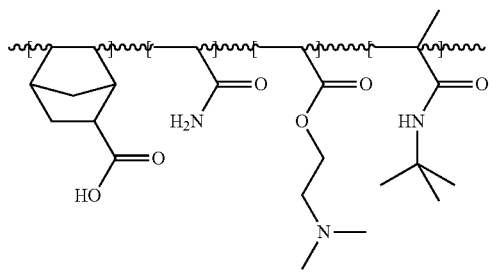

Synthesis Example 10

500 ml 3-neck flask was charged with 9.5 g of monomer acrylamide for polymerization, 9.5 g of dimethylaminoethylacrylate and 7.8 g of n-hexylmethacrylamide dissolved in 31 g of 1,4-dioxane. 250 ml flask was charged with 4.0 g of 5-norbornene-2-carboxylic acid and 2.0 g of dimethylazobisisobutylate of a polymerization initiator dissolved in 94.2 g of 1,4-dioxane and a solution in the 250 ml flask was stirred under nitrogen($N_2$) injection for one hour while maintaining room-temperature. While maintaining a temperature of a reactor at 65° C., a solution in the 250 ml flask was dropped slowly into a solution in the 500 ml 3-neck flask using a syringe pump for 1 hour. After allowing to react at the room-temperature for 10 hours, a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a tenth water-soluble polymer of Formula 16 was collected (21.8 g, 71% yield). Polystyrene-referenced weight-average molecular weight (Mw) of the ninth water-soluble polymer was 7,900 of and a ratio of weight-average molecular weight to number-average molecular weight (Mw/Mn) thereof was 2.81.

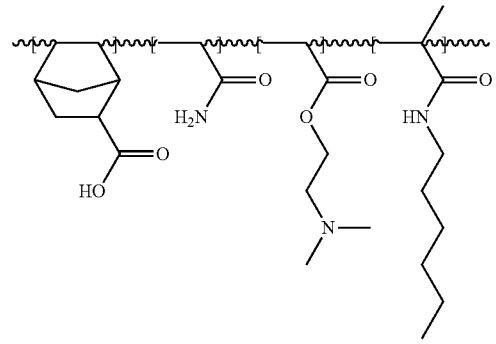

Comparative Synthesis Example 1

For polymerization, 500 ml 3-neck flask was charged with 10.0 g of monomer acrylamide, 8.0 g of hydroxyethylaerylamide and 9.0 g of dimethylaminoethylmethacrylate dissolved in 31 g of 1,4-dioxane. After allowing to react at the room-temperature for 10 hours while maintaining a temperature of a reactor at 65° C., a reaction solution that polymerization was completed was cooled at the room-temperature. A large amount of n-hexane was added in the cooled reaction solution to precipitate. And precipitates were filtered. And then, the precipitated reaction solution was dried under reduced pressure after being washed many times with a single solvent such that a eleventh water-soluble polymer of Formula 17 was collected (15.9, 59% yield). Polystyrene-referenced weight-average molecular weight (Mw) of the ninth water-soluble polymer was 9,300 of and a ratio of weight-average molecular weight to number-average molecular weight (Mw/Mn) thereof was 3.42.

[Chemical Formula 17]

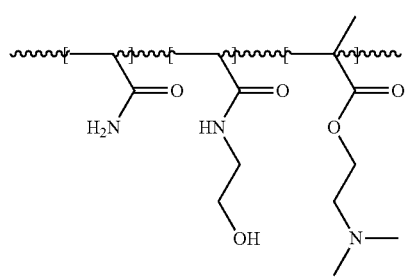

Photoresist Resin Synthesis

Synthesis Example 11

For polymerization, 10.0 g of 2-methyl 2-adamantyl methacrylate, 7.3 g of γ-butyrolactyl methacrylate and 10.1 g of 3-hydroxy 1-adamantyl methacrylate were dissolved in 31 g of 1,4-dioxane. 250 ml flask was charged with 4 g of norbornene and 2.0 g of AIBN of polymerization initiator dissolved in 94.2 g of 1,4-dioxane of polymerization solvent, and a solution in the 250 ml flask was stirred under nitrogen ($N_2$) injection at a room-temperature for one hour. While maintaining a temperature of a reactor at 65° C., a solution in the 250 ml flask was dropped slowly into a solution in the 500 ml 3-neck flask using a syringe pump for 1 hour. After allowing to react at the room-temperature for 16 hours, a reaction solution that polymerization was completed was cooled at the room-temperature. N-hexane was added in the cooled reaction solution to precipitate. And precipitates were filtered. And then, the precipitated reaction solution was dried under reduced pressure after being washed many times with a single solvent such that a twelfth water-soluble polymer of Formula 18 was collected (21 g, 67% yield). Polystyrene-referenced weight-average molecular weight (Mw) of the twelfth water-soluble polymer was 8,800 of and a ratio of weight-average molecular weight to number-average molecular weight (Mw/Mn) thereof was 1.86.

[Chemical Formula 18]

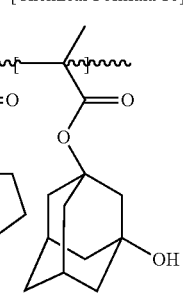

Manufacture of Photoresist Layer and Evaluation

Example 1

Forming Contact Hole 100 parts by weight of The polymer acquired by Synthesis Example 11, 2.5 parts by weight of triphenyl sulfonium nonaflate as an acid generator, 0.75 part by weight of tetramethyl amoniumhydroxide 0.75 parts by weight as an alkaline additive were added into 1,000 parts by weight of the propyleneglycol methyl ether acetate to form a film having a thickness of 0.2 μm. Acquired photoresist solution was doped on a substrate by using spinner, and then the solution was dried at a temperature of about 110° C. for 60 seconds to form a layer of 0.2 μm. The formed layer was exposed by ArF excimer laser stepper (numerical aperture; NA: 0.78) and then heat-treated at a temperature of 110° C. for 60 seconds. The heat-treated layer was developed by solution of tetramethyl ammonium hydroxide of 2.38 wt % for 40 seconds, and then washed and dried to for a contact hole pattern. A size of the contact hole was measured by Scanning Electron Microscope (SEM), and the measured size was 123.1 nm.

Example 2

The resin of 3.0 g acquired by Synthesis Example 1 (Chemical Formula 2) was fully dissolved into a mixture of distilled water of 95 g and isopropylalcohol of 5 g, and then was filtered by a membrane filter of 0.2 μm to prepare a water-soluble resin composition (composition for coating the photoresist). The water-soluble resin composition was spin-coated on a wafer on which a contact hole pattern is formed to form coated thin layer. Then, the coated thin layer was heat-treated in an oven of 150° C. for 60 seconds to promote a cross-linking reaction. And the wafer coated with the composition was washed and rotated with deionized water for 60 seconds to remove a non-cross linked portion. The contact hole size measured by SEM was 91.6 mm, which showed that 31.5 mm was reduced from an initial size.

Examples 3 to 11

Example 3 to 11 were identical to the Example 2 except the water soluble resin composition as described in table 2 as below. In the same manner of Example 2, each of the water-soluble resin composition of Examples 3 to 11 was spin-coated on the wafer on which the contact hole pattern was formed to form a thin layer, and then contact hole size was measured as that of Example 2.

Comparative Example 1

Comparative Example 1 was identical to the Example 2 except the water soluble resin composition as described in table 2 as below. In the same manner of Example 2, the water-soluble resin composition of Comparative Examples 1 was spin-coated on the wafer on which the contact hole pattern was formed to form a thin layer, and then contact hole size was measured as that of Example 2.

All measured results are also represented in Table 1 below.

TABLE 1

| Example | Polymer | Contact hole size before composition was applied to | Contact hole size after composition was applied to | Reduced size |
|---------|---------|------------------------------------------------|-----------------------------------------------|--------------|
| Example 3 | Formula 3 | 123.1 nm | 92.0 nm | 31.1 nm |
| Example 4 | Formula 4 | 123.1 nm | 96.6 nm | 26.5 nm |
| Example 5 | Formula 5 | 123.1 nm | 93.8 nm | 29.3 nm |
| Example 6 | Formula 6 | 123.1 nm | 95.1 nm | 28.0 nm |
| Example 7 | Formula 7 | 123.1 nm | 97.0 nm | 26.1 nm |
| Example 8 | Formula 8 | 123.1 nm | 100.4 nm | 22.7 nm |
| Example 9 | Formula 14 | 123.1 nm | 90.9 nm | 32.2 nm |
| Example 10 | Formula 15 | 123.1 nm | 102.0 nm | 21.1 nm |

TABLE 1-continued

| Example | Polymer | Contact hole size before composition was applied to | Contact hole size after composition was applied to | Reduced size |
|---|---|---|---|---|
| Example 11 | Formula 16 | 123.1 nm | 96.8 nm | 26.3 nm |
| Comparative Example 1 | Formula 17 | 123.1 nm | 113.3 nm | 9.8 nm |

As known in table 1, a degree of reduced contact hole size of each Examples was remarkably excellent with comparison to that of Comparative Example 1.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A water-soluble resin composition for forming fine patterns comprising a water-soluble polymer and a first water-soluble solvent
wherein the water-soluble polymer is selected from the group consisting of Chemical Formula 2, Chemical Formula 3, Chemical Formula 4, Chemical Formula 5, Chemical Formula 6, Chemical Formula 7, Chemical Formula 8, Chemical Formula 9, Chemical Formula 10, Chemical Formula 11, Chemical Formula 12, Chemical Formula 13, Chemical Formula 14, Chemical Formula 15, and Chemical Formula 16 as shown below

[Chemical Formula 2]

[Chemical Formula 3]

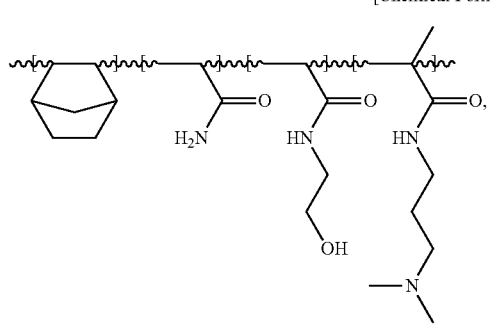

[Chemical Formula 4]

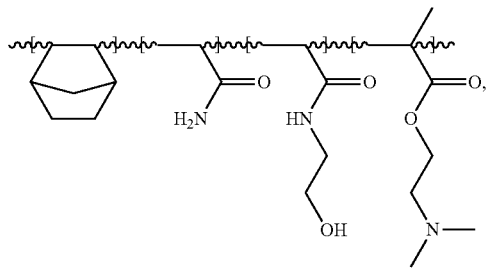

[Chemical Formula 5]

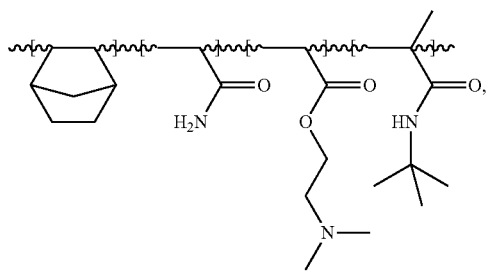

[Chemical Formula 6]

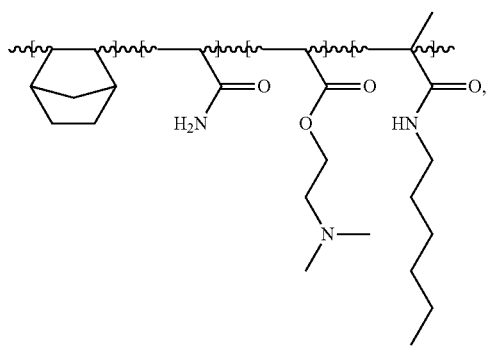

[Chemical Formula 7]

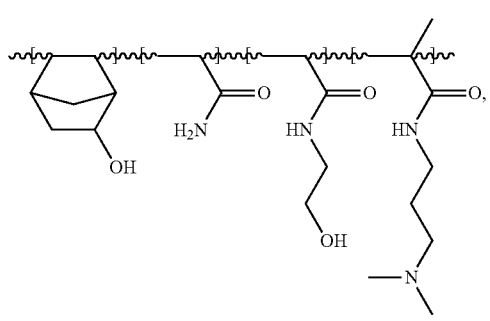

[Chemical Formula 8]

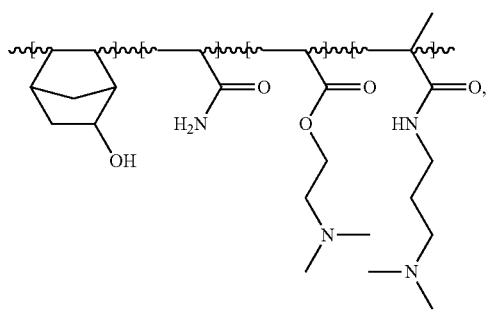

[Chemical Formula 9]

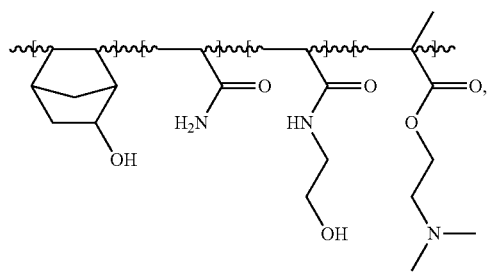

[Chemical Formula 10]

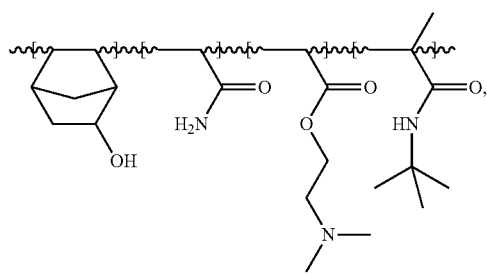

[Chemical Formula 11]

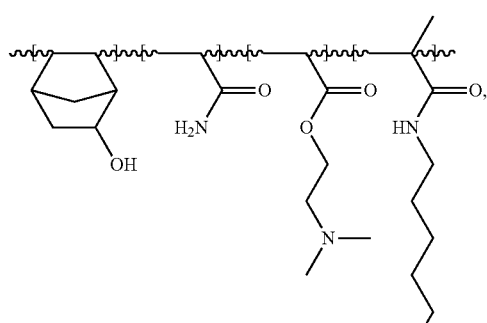

[Chemical Formula 12]

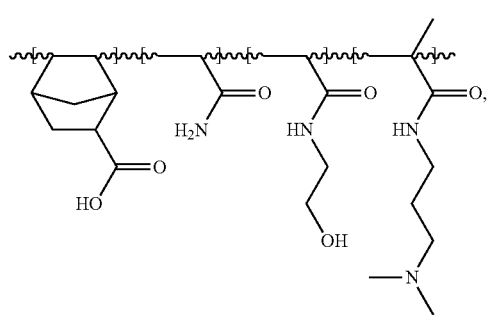

[Chemical Formula 13]

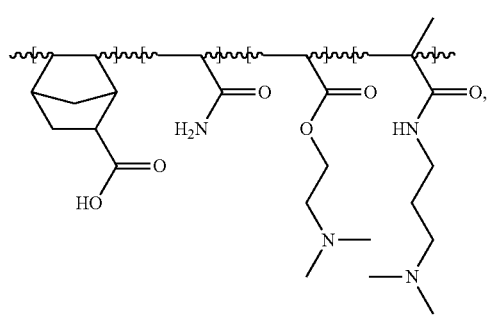

[Chemical Formula 14]

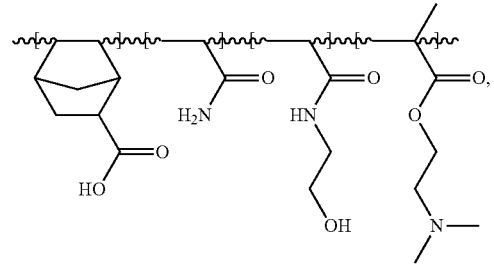

[Chemical Formula 15]

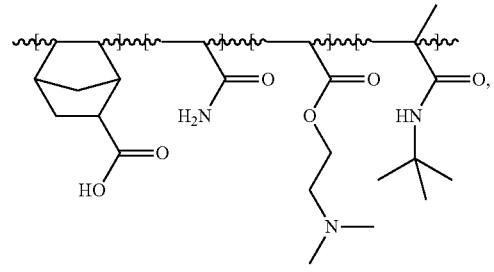

and

[Chemical Formula 16]

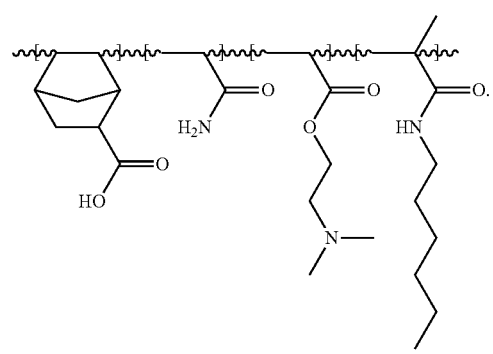

2. The water-soluble resin composition of claim 1, wherein the water-soluble solvent comprises about 100 parts by weight of water and about 1 to about 20 parts by weight of an alcohol.

3. The water-soluble resin composition of claim 2, wherein the alcohol comprises an alkoxy alcohol.

4. The water-soluble resin composition of claim 1, wherein the water-soluble resin composition comprises about 100 parts by weight of the first water-soluble solvent and about 0.01 to about 15 parts by weight of the water-soluble polymer.

5. The water-soluble resin composition of claim 1, wherein the water-soluble polymer has about 3,000 to about 50,000 of polystyrene-referenced weight-average molecular weight (Mw) by Gel-permeation chromatography (GPC).

6. The water-soluble resin composition of claim 5, wherein the water-soluble polymer has about 1.0 to about 5.0 of molecular weight distribution (weight-average molecular weight/number-average molecular weight).

7. A method of forming fine pattern comprising:
   forming a photoresist layer;
   forming a contact hole on the photoresist layer by photolithography method to prepare a photoresist pattern layer;
   coating water-soluble resin composition of claim 1 on the photoresist pattern layer;

heat-treating the photoresist pattern layer coated by the water-soluble resin composition to form a coating layer having a cross-linked part; and applying a second water-soluble solvent to the coating layer for removing the coating layer except for the cross-linked part.

8. The method of claim 7, wherein the second water-soluble solvent comprises water.

9. The method of claim 7, wherein the heat-treating of the photoresist pattern layer is performed at a temperature of about 10° C. to about 200° C.

10. The method of claim 7, wherein a thickness of the coating layer with the cross-linked part is controlled by the heat-treating temperature to control a size of a contact hole.

11. The method of claim 7, wherein the photoresist layer includes norbornene derivatives, and the photoresist layer comprises a non-water-soluble layer.

12. The water-soluble resin composition of claim 1, wherein the water-soluble resin polymer is selected from the group consisting of Chemical Formula 2, Chemical Formula 3, Chemical Formula 4, Chemical Formula 5, and Chemical Formula 6.

13. The water-soluble resin composition of claim 1, wherein the water-soluble resin polymer is selected from the group consisting of Chemical Formula 7, Chemical Formula 8, Chemical Formula 9, Chemical Formula 10, and Chemical Formula 11.

14. The water-soluble resin composition of claim 1, wherein the water-soluble resin polymer is selected from the group consisting of Chemical Formula 12, Chemical Formula 13, Chemical Formula 14, Chemical Formula 15, and Chemical Formula 16.

15. The water-soluble resin composition of claim 1, wherein the water-soluble resin polymer is selected from the group consisting of Chemical Formula 3, Chemical Formula 4, Chemical Formula 5, Chemical Formula 6, Chemical Formula 8, Chemical Formula 9, Chemical Formula 10, Chemical Formula 11, Chemical Formula 13, Chemical Formula 14, Chemical Formula 15, and Chemical Formula 16.

16. The water-soluble resin composition of claim 1, wherein the water-soluble resin polymer is selected from the group consisting of Chemical Formula 2, Chemical Formula 4, Chemical Formula 7, Chemical Formula 9, Chemical Formula 12, and Chemical Formula 14.

17. The water-soluble resin composition of claim 1, wherein the water-soluble resin polymer is selected from the group consisting of Chemical Formula 5, Chemical Formula 10, and Chemical Formula 15.

18. The water-soluble resin composition of claim 1, wherein the water-soluble resin polymer is selected from the group consisting of Chemical Formula 2, Chemical Formula 3, Chemical Formula 7, Chemical Formula 8, and Chemical Formula 13.

19. The water-soluble resin composition of claim 1, wherein the water-soluble resin polymer is selected from the group consisting of Chemical Formula 6, Chemical Formula 11, and Chemical Formula 16.

\* \* \* \* \*